United States Patent
Honda et al.

(10) Patent No.: US 9,431,479 B2
(45) Date of Patent: Aug. 30, 2016

(54) HIGH BREAKDOWN VOLTAGE SEMICONDUCTOR DEVICE HAVING A RESURF LAYER

(75) Inventors: Shigeto Honda, Tokyo (JP); Atsushi Narazaki, Tokyo (JP); Kaoru Motonami, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 403 days.

(21) Appl. No.: 12/845,176

(22) Filed: Jul. 28, 2010

(65) Prior Publication Data

US 2011/0084354 A1    Apr. 14, 2011

(30) Foreign Application Priority Data

Oct. 13, 2009 (JP) .................. 2009-235995

(51) Int. Cl.
| | |
|---|---|
| H01L 29/06 | (2006.01) |
| H01L 29/40 | (2006.01) |
| H01L 29/66 | (2006.01) |
| H01L 29/861 | (2006.01) |
| H01L 29/16 | (2006.01) |
| H01L 29/20 | (2006.01) |
| H01L 29/78 | (2006.01) |

(52) U.S. Cl.
CPC ......... *H01L 29/0615* (2013.01); *H01L 29/063* (2013.01); *H01L 29/0657* (2013.01); *H01L 29/0661* (2013.01); *H01L 29/402* (2013.01); *H01L 29/66128* (2013.01); *H01L 29/8611* (2013.01); *H01L 29/0638* (2013.01); *H01L 29/1608* (2013.01); *H01L 29/2003* (2013.01); *H01L 29/7811* (2013.01)

(58) Field of Classification Search
CPC .................................................... H01L 29/063
USPC .................. 257/493, E29.023; 438/140, 433
See application file for complete search history.

(56) References Cited

U.S. PATENT DOCUMENTS

| | | | |
|---|---|---|---|
| 6,054,748 A | 4/2000 | Tsukuda et al. | |
| 6,429,501 B1 | 8/2002 | Tsuchitani et al. | |
| 6,476,458 B2 | 11/2002 | Miyajima | |

(Continued)

FOREIGN PATENT DOCUMENTS

| | | |
|---|---|---|
| CN | 1632931 A | 6/2005 |
| JP | 8-306937 | 11/1996 |

(Continued)

OTHER PUBLICATIONS

Office Action issued Mar. 27, 2012 in Korean Patent Application No. 10-2010-0088206 (The partial English translation of the Korean Office Action is translated based on the Japanese translation).

(Continued)

*Primary Examiner* — Eduardo A Rodela
*Assistant Examiner* — Christopher M Roland
(74) *Attorney, Agent, or Firm* — Oblon, McClelland, Maier & Neustadt, L.L.P.

(57) ABSTRACT

In a semiconductor device according to the present invention, an electrode layer and a recessed part are formed on a surface of a semiconductor substrate. Further, in the semiconductor substrate, a RESURF layer that is in contact with a bottom surface of the recessed part and the electrode layer is formed. In addition, an insulating film is formed on an upper surface of the semiconductor substrate so as to fill the recessed part. Moreover, a field plate electrode is formed on the insulating film above the recessed part.

10 Claims, 12 Drawing Sheets

(56) References Cited

U.S. PATENT DOCUMENTS

| | | | |
|---|---|---|---|
| 6,566,224 B1* | 5/2003 | Chang et al. | 438/424 |
| 2001/0053581 A1 | 12/2001 | Mosher et al. | |
| 2005/0059256 A1 | 3/2005 | Watanabe | |
| 2007/0148832 A1* | 6/2007 | Kanemoto | 438/149 |
| 2008/0296636 A1 | 12/2008 | Darwish et al. | |
| 2009/0085116 A1* | 4/2009 | Aoki | 257/355 |

FOREIGN PATENT DOCUMENTS

| | | |
|---|---|---|
| JP | 2000-260985 A | 9/2000 |
| JP | 2005-64472 A | 3/2005 |

OTHER PUBLICATIONS

Office Action issued Apr. 17, 2012 in German Patent Application No. 10 2010 042 381.5 (with English translation).

Combined Chinese Office Action and Search Report issued Aug. 31, 2012, in Chinese Patent Application No. 2010102676580 with English and Japanese translations.

U.S. Appl. No. 12/882,699, filed Sep. 15, 2010, Honda.

Japanese Office Action issued Mar. 19, 2013 in Patent Application No. 2009-235995 with English Translation.

Chinese Office Action mailed on May 28, 2013 in Chinese Patent Application No. 201010267658.0 (with partial English Translation).

Combined Office Action and Search Report issued Jan. 16, 2014 in Chinese Patent Application No. 201010267658.0 (with English translation).

Official Summons to an Oral Hearing issued Mar. 25, 2014 in German Patent Application No. 10 2010 042 381.5 with English language translation.

Combined Chinese Office Action and Search Report issued Jul. 29, 2014 in Patent Application No. 201010267658.0 (with partial English language translation).

Office Action issued on Jul. 10, 2014 in the corresponding German Patent Application No. 10 2010 042 381.5 (with English Translation).

* cited by examiner

| GAP | UNEVENNESS IN APPLICATION |
|---|---|
| 0.5 μm | ABSENCE |
| 0.8 μm | ABSENCE |
| 1.0 μm | PRESENCE |
| 1.5 μm | PRESENCE |
| 2.0 μm | PRESENCE |

F I G. 3 0
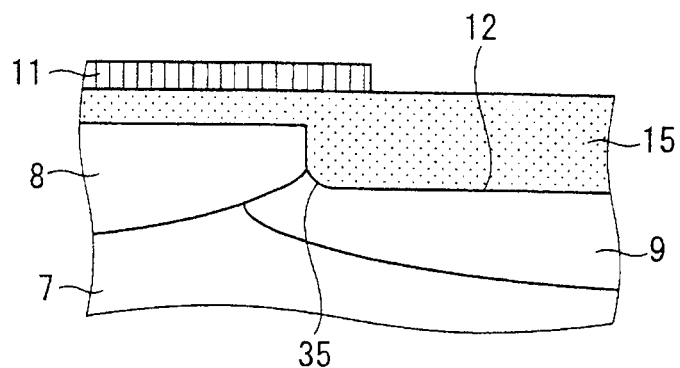
F I G. 3 1
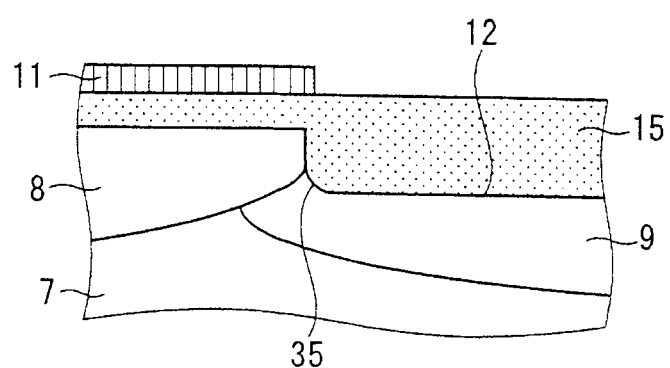

HIGH BREAKDOWN VOLTAGE SEMICONDUCTOR DEVICE HAVING A RESURF LAYER

BACKGROUND OF THE INVENTION

1. Field of the Invention

The present invention relates to a semiconductor device and a method of manufacturing a semiconductor device, which is applicable to a power semiconductor device required to have high breakdown voltage.

2. Description of the Background Art

In junction terminations of high-breakdown-voltage semiconductor devices such as high-breakdown-voltage diodes, bipolar transistors, power MOSFETs and IGBTs, an electric field at an end of a depletion layer in the vicinity of a principal junction surface needs to be mitigated. In order to mitigate the electric field at the end of the depletion layer, there has been conventionally employed a field plate structure or a forming structure for a reduced surface field (hereinafter, referred to as RESURF).

For example, Japanese Patent Application Laid-Open No. 08-306937 discloses the technology of combining the field plate structure and the RESURF layer forming structure, to thereby improve device breakdown voltage.

In the structure shown in FIG. 3 of Japanese Patent Application Laid-Open No. 08-306937, a RESURF layer is formed in a surface of an n type semiconductor substrate. The RESURF layer is formed so as to be connected to an electrode layer (p type anode region), and is composed of p type impurities having lower concentration compared with the electrode layer. In addition, the RESURF layer is formed with a predetermined distance from a channel stopper layer formed in the surface of the semiconductor substrate. Further, the semiconductor device shown in FIG. 3 of Japanese Patent Application Laid-Open No. 08-306937 is provided with a conductive film (field plate electrode) on the RESURF layer via an insulating film.

In a case where the thickness of the insulating film under the field plate electrode is small, which is disclosed in Japanese Patent Application Laid-Open No. 08-306937, avalanche occurs in the vicinity of the end of the field plate electrode, leading to a decrease in device breakdown voltage. Accordingly, the insulating film under the field plate electrode needs to have a large thickness.

However, the thickness of the insulating film causes an increase in gap between the semiconductor substrate and the insulating film. The increase in gap causes, for example, unevenness in resist application during resist formation or a decrease in focus margin during photolithography.

SUMMARY OF THE INVENTION

An object of the present invention is to provide, in a manufacturing process for a semiconductor device having a field plate structure and a RESURF forming structure, a semiconductor device capable of preventing the generation of unevenness in application during resist application and achieving an improvement in focus margin during photolithography, and a method of manufacturing the semiconductor device.

According to the present invention, a semiconductor device includes a semiconductor substrate, an electrode layer, a RESURF layer, an insulating film and field plate electrode. The semiconductor substrate has a first conductivity type and has an upper surface on which a recessed part is formed. The electrode layer has a second conductivity type and is formed in a surface of the semiconductor substrate so as to be adjacent to the recessed part. The RESURF layer contains impurities of the second conductivity type lower in concentration than the electrode layer and is formed in the semiconductor substrate so as to be in contact with a bottom surface of the recessed part and the electrode layer. The insulating film is formed on the upper surface of the semiconductor substrate so as to fill the recessed part. The field plate electrode is formed on the insulating film above the recessed part.

Accordingly, a reduction in thickness of the insulating film on the upper surface of the semiconductor substrate other than the recessed part is achieved. Therefore, even when the resist application treatment is performed from the upper surface of the semiconductor substrate to the upper surface of the insulating film after the formation of the insulating film, the generation of unevenness in application is suppressed. In addition, even when photolithography is performed from the upper surface of the semiconductor device to the upper surface of the insulating film after the formation of the insulating film, focus margin is improved. Note that the thickness of the insulating film above the RESURF layer is increased owing to the presence of the recessed part. Therefore, it is possible to improve device breakdown voltage as well.

According to the present invention, a method of manufacturing a semiconductor device includes the steps (A), (B), (C), (D) and (E). In the step (A), a recessed part is formed on a surface of a semiconductor substrate having a first conductivity type. In the step (B), impurities of a second conductivity type are implanted into the semiconductor substrate to form an electrode layer to be adjacent to the recessed part in the surface of the semiconductor substrate. In the step (C), the impurities of the second conductivity type lower in concentration than the electrode layer are implanted into the semiconductor substrate to form, in the semiconductor substrate, a RESURF layer to be in contact with a bottom surface of the recessed part and the electrode layer. In the step (D), an insulating film is formed so as to fill the recessed part. In the step (E), a field plate electrode is formed on the insulating film above the recessed part.

Accordingly, a reduction in thickness of the insulating film on the upper surface of the semiconductor substrate other than the recessed part is achieved. Therefore, even when the resist application treatment is performed from the upper surface of the semiconductor substrate to the upper surface of the insulating film after the formation of the insulating film, the generation of unevenness in application is suppressed. In addition, even when photolithography is performed from the upper surface of the semiconductor substrate to the upper surface of the insulating film after the formation of the insulating film, focus margin is improved. Note that the thickness of the insulating film above the RESURF layer is increased owing to the presence of the recessed part. Therefore, it is possible to improve device breakdown voltage as well.

These and other objects, features, aspects and advantages of the present invention will become more apparent from the following detailed description of the present invention when taken in conjunction with the accompanying drawings.

BRIEF DESCRIPTION OF THE DRAWINGS

FIG. 30 is a cross-sectional view showing a structure of a semiconductor device according to an eighth preferred embodiment; and FIG. 31 is a cross-sectional view showing, in plan view, a structure in which the corner part of the recessed part is not covered with a field plate electrode.

DESCRIPTION OF THE PREFERRED EMBODIMENTS

Preferred embodiments of the present invention are specifically described below with reference to the drawings.

First Preferred Embodiment

Figure 1:
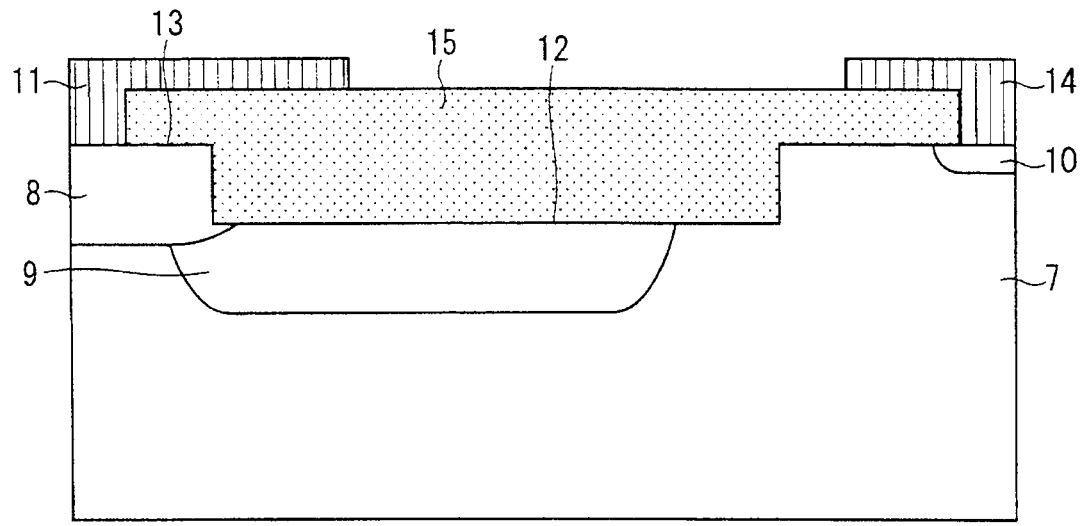
FIG. 1 is a cross-sectional view showing a structure of a junction termination end of a semiconductor device according to a first preferred embodiment.

FIG. 1 is a cross-sectional view showing a structure of a junction termination end of a high-breakdown-voltage semiconductor device (diode) according to a first preferred embodiment.

In the structure shown in FIG. 1, an electrode layer 8 of p type conductivity is formed in a surface of a semiconductor substrate 7 of n type conductivity. On an upper surface of the semiconductor substrate 7, a recessed part 12 is formed. The recessed part 12 is formed so as to intersect the electrode layer 8, and a part of the recessed part 12 is formed in the electrode layer 8. That is, the electrode layer 8 and the recessed part 12 are adjacent to each other. In the structure shown in FIG. 1, the bottom surface of the electrode layer 8 is located at a position deeper than the recessed part 12.

A reduced surface field (RESURF) layer 9 is formed in the semiconductor substrate 7 so as to surround the electrode layer 8. The RESURF layer 9 is composed of p type (p-type) impurities having lower concentration compared with the electrode layer 8. As shown in FIG. 1, the RESURF layer 9 is in contact with a part of a bottom surface of the electrode layer 8 and a part of a bottom surface of the recessed part 12 so as to cover an intersecting portion between the electrode layer 8 and the recessed part 12 from downward.

Further, in a periphery part of the semiconductor substrate 7, a channel stopper layer 10 is formed in the surface of the semiconductor substrate 7. The channel stopper layer 10 has n type conductivity, and impurity concentration of the channel stopper layer 10 is higher than impurity concentration of the semiconductor substrate 7 (n+ type). In addition, the channel stopper layer 10 is formed in the surface of the semiconductor substrate 7 so as to surround respective components (electrode layer 8, RESURF layer 9 and recessed part 12) with a predetermined distance.

An insulating film 15 is formed on the upper surface of the semiconductor substrate 7 so as to fill the recessed part 12. As shown in FIG. 1, the insulating film 15 is formed also in a part of an upper surface 13 of the semiconductor substrate 7 that is located at a position higher than the recessed part 12. Therefore, the thickness of the insulating film 15 that is formed in the recessed part 12 above the RESURF layer 9 is larger than the thickness of the insulating film 15 that is formed on the upper surface 13 of the semiconductor substrate 7.

Further, as shown in FIG. 1, field plate electrodes 11 and 14 are formed so as to extend from the upper surface of the semiconductor substrate 7 to the upper surface of the insulating film 15. The field plate electrodes 11 and 14 are applied with a predetermined voltage, which enlarges a depletion layer generated in the semiconductor substrate 7.

Here, a part of the field plate electrode 11 is in contact with the electrode layer 8 exposed from the upper surface 13 of the semiconductor substrate 7, and the other part of the field plate electrode 11 is formed on the insulating film 15. More specifically, the field plate electrode 11 is disposed from the upper surface of the electrode layer 8 to the upper surface of the insulating film 15 having the large film thickness above the recessed part 12. Accordingly, in plan view, the field plate electrode 11 covers the electrode layer 8 and a part of the RESURF layer 9.

A part of the field plate electrode 14 is in contact with the channel stopper layer 10 exposed from the upper surface 13 of the semiconductor substrate 7, and the other part of the field plate electrode 14 is formed on the insulating film 15. In other words, the field plate electrode 14 is disposed from an upper surface of the channel stopper layer 10 to an upper surface of the insulating film 15. Accordingly, in plan view, the field plate electrode 14 covers at least the channel stopper layer 10.

Next, a method of manufacturing the high-breakdown-voltage semiconductor device according to the first preferred embodiment is described with reference to process cross-sectional views.

First, for example, the semiconductor substrate 7 of n type that has a specific resistance p of 23 Ω·cm and a thickness of 725 μm is prepared.

Next, a resist pattern is formed on the semiconductor substrate 7 by photolithography. Then, the resist pattern is used as a mask, to thereby implant boron ion (referred to as first boron ion implantation treatment) into the semiconductor substrate 7. The first boron ion implantation treatment is performed on the conditions of, for example, implantation energy of 2.0

Figure 2:
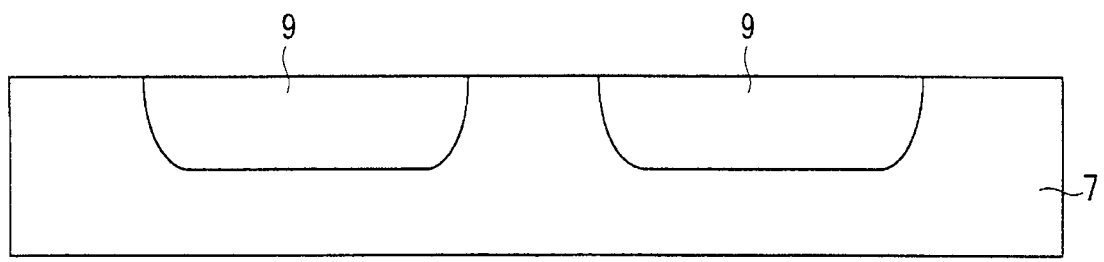
FIGS. 2 to 8 are process cross-sectional views for describing a method of manufacturing the semiconductor device according to the first preferred embodiment.

MeV and concentration of 1.0E12 atoms/cm². The resist pattern is removed after the first boron ion implantation treatment, to thereby perform thermal diffusion treatment on the semiconductor substrate 7. As a result, as shown in FIG. 2, the RESURF layer 9 of p type is formed in the surface of the semiconductor substrate 7. In this case, the thermal diffusion treatment is performed on the conditions of, for example, temperature of 1,200° C. and time of 1,200 min.

Figure 3:
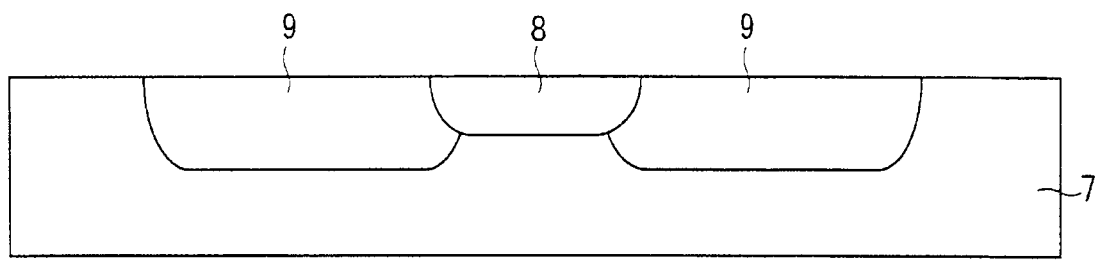

Next, a resist pattern is formed on the semiconductor substrate 7 by photolithography again. Then, the resist pattern is used as a mask, to thereby implant boron ion (referred to as second boron ion implantation treatment) into the semiconductor substrate 7. The second boron ion implantation treatment is performed on the conditions of, for example, implantation energy of 50 keV and concentration of 3.0E14 atoms/cm². The resist pattern is removed after the second boron ion implantation treatment, to thereby perform thermal diffusion treatment on the semiconductor substrate 7 again. As a result, as shown in FIG. 3, the electrode layer 8 of p type is formed in the surface on the semiconductor substrate 7. In this case, the thermal diffusion treatment is performed on the conditions of, for example, temperature of 1,150° C. and time of 300 min.

As can be seen from the conditions of the respective boron ion implantation treatments, the impurity ion concentration of the RESURF layer 9 is lower than the impurity concentration of the electrode layer 8. Moreover, the depth of the RESURF layer 9 is larger than the depth of the electrode layer 8. Note that both sides of the electrode layer 8 are in contact with the RESURF layer 9, and the RESURF layer 9 surrounds the electrode layer 8 in plan view.

Figure 4:
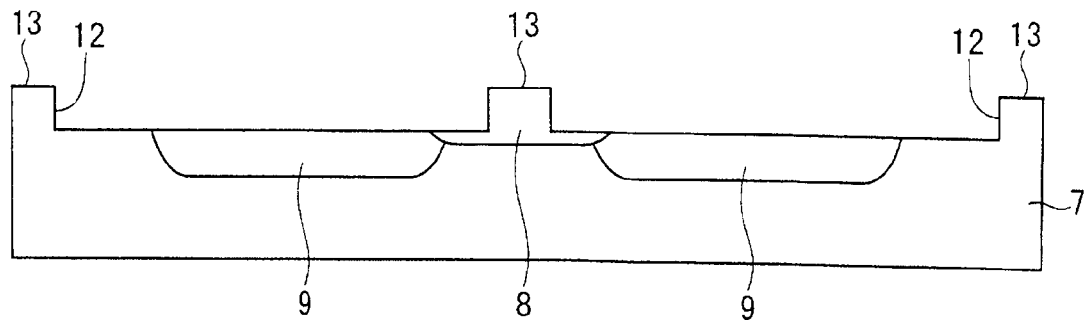

Next, a resist pattern is formed on the semiconductor substrate 7 by the third photolithography. Then, the resist pattern is used as a mask, and etching is performed on the semiconductor substrate 7. As a result of the etching, the recessed part 12 having a depth of 1 μm is formed as shown in FIG. 4. As shown in FIG. 4, though a part of the electrode layer 8 (electrode layer 8 existing between the recessed parts 12 in FIG. 4) remains without being removed, an upper part of the other portion of the electrode layer 8 and an upper part of the RESURF layer 9 are removed. As shown in FIG. 4, the electrode layer 8, the RESURF layer 9 and the n type semiconductor substrate 7 are exposed from the bottom surface of the recessed part 12. As a result of the formation of the recessed part 12, the upper surface of the semiconductor substrate 7 is composed of bottom surfaces of the recessed parts 12 and the upper surface 13 located at a higher position than the bottom surfaces of the recessed parts 12.

Figure 5:
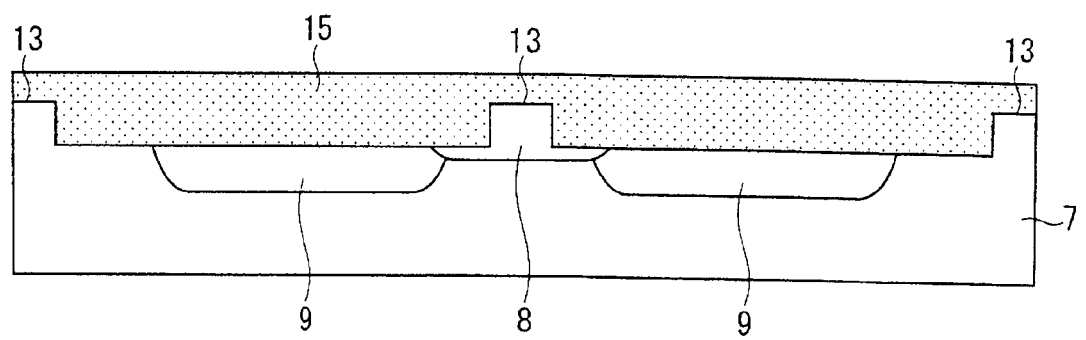

Then, thermal oxidation treatment is performed on the upper surface of the semiconductor substrate 7 in which the recessed parts 12 are formed. As a result of the thermal oxidation treatment, the insulating film 15 that is an oxide film is formed. After that, planarization treatment (for example, chemical mechanical polishing (CMP) treatment) is performed on the upper surface of the insulating film 15. Through the thermal oxidation treatment and planarization treatment, the insulating film 15 is formed on the upper surface 13 of the semiconductor substrate 7 so as to fill the recessed parts 12, as shown in FIG. 5. The upper surface of the insulating film 15 is planarized, and the thickness of the insulating film 15 is approximately 1.5 μm in the recessed part 12.

Figure 6:
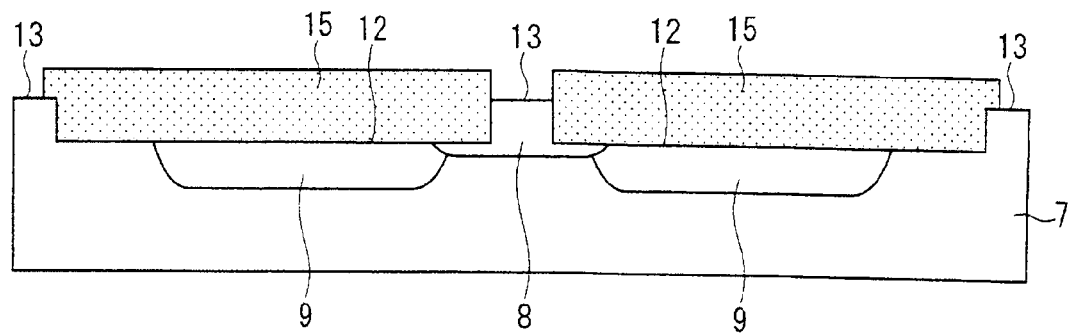

Then, a resist pattern is formed on the insulating film 15 by the fourth photolithography. The resist pattern is used as a mask, and dry etching is performed on the insulating film 15. As a result of the dry etching, as shown in FIG. 6, a plurality of openings are formed in the insulating film 15. The upper surface 13 of the semiconductor substrate 7 is partially exposed from bottom surfaces of part of the openings. In addition, the electrode layer 8 is partially exposed from bottom surfaces of other openings.

Then, a resist pattern is formed on the insulating film 15 and the semiconductor substrate 7 by the fifth photolithography. Although the resist pattern is not shown, the upper surface of the electrode layer 8 is covered with the resist pattern, and a part of the upper surface 13 of the semiconductor substrate 7 is exposed through an opening of the resist pattern.

Figure 7:
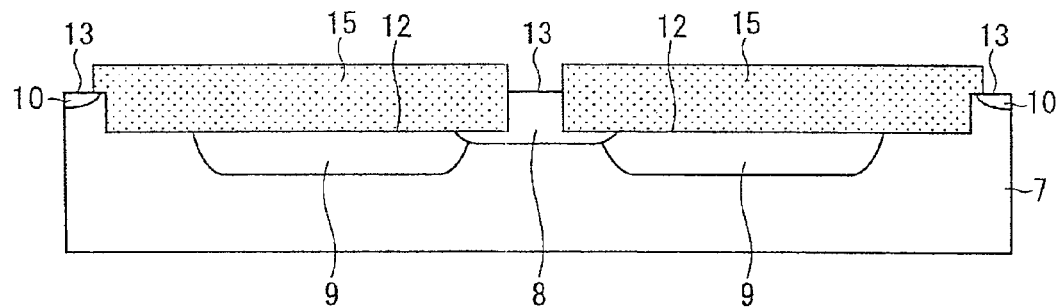

Then, the resist pattern is used as a mask, and arsenic ion is implanted (referred to as arsenic ion implantation treatment) into the exposed upper surface 13 of the semiconductor substrate 7. The arsenic ion implantation treatment is performed on the conditions of, for example, implantation energy of 50 keV and concentration of 2.0E15 atoms/cm². The resist pattern is removed after the arsenic ion implantation treatment, to thereby perform thermal diffusion treatment on the semiconductor substrate 7 again. As a result, as shown in FIG. 7, the channel stopper layer 10 of n+ type is formed in the surface of the semiconductor substrate 7. In this case, the thermal diffusion treatment is performed on the conditions of, for example, temperature of 1,150° C. and time of 15 min. Note that in plan view, the channel stopper layer 10 surrounds the RESURF layer 9 with a predetermined distance.

Then, sputtering is performed on the semiconductor substrate 7 having the structure shown in FIG. 7 from the upper surface thereof. As a result of the sputtering, an aluminum (Al)-silicon (Si) film is formed on the upper surface 13 of the semiconductor substrate 7 and the upper surface of the insulating film 15. In this case, the thickness of the Al—Si film on the upper surface 13 of the semiconductor substrate 7 is, for example, 4 μm.

Figure 8:
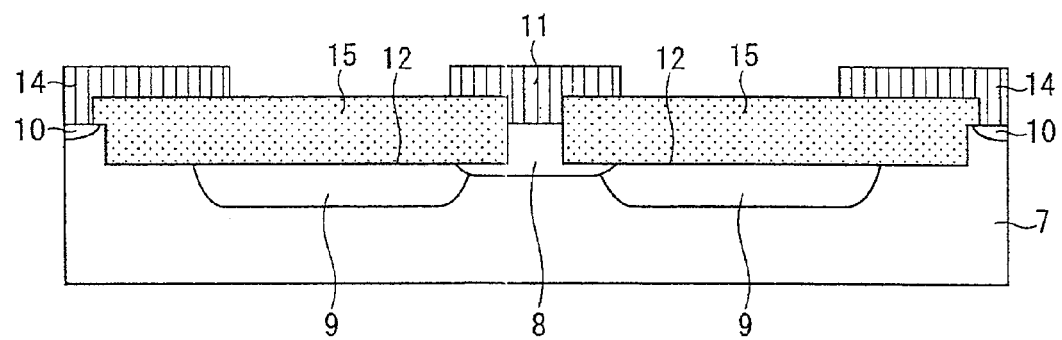

Then, a resist pattern is formed on the Al—Si film by the sixth photolithography. Then, the resist pattern is used as a mask, to thereby perform dry etching on the Al—Si film. The Al—Si film is partially removed by the dry etching, and thus, the field plate electrodes 11 and 14 are formed as shown in FIG. 8. As shown in FIG. 8, the field plate electrode 11 having a T-shaped cross section is formed from the upper surface of the electrode layer 8 to the upper surface of the insulating film 15. On the other hand, each field plate electrode 14 having an L-shaped cross section is formed from the upper surface of the channel stopper layer 10 to the upper surface of the insulating film 15.

Then, effects of the first preferred embodiment of the present invention are described through comparison with Comparative Example.

Figure 9:
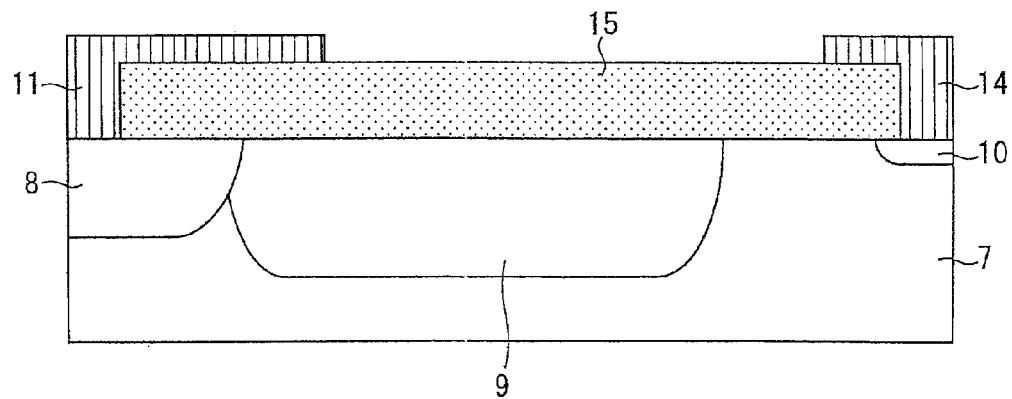
FIG. 9 is a cross-sectional view showing a structure of Comparative Example.

In Comparative Example, a semiconductor device is formed by omitting the formation step for the recessed part 12 (step of FIG. 4) in the manufacturing process for a semiconductor device described above. The semiconductor device according to Comparative Example which has the structure shown in FIG. 9 is formed through the manufacturing process in which the formation step for the recessed part 12 is omitted. In Comparative Example, needless to say, the recessed part is not formed on the upper surface of the semiconductor substrate 7. In addition, the thickness of the insulating film 15 formed on the semiconductor substrate 7 is uniform (in the structures of FIGS. 1 and 8 above, the insulating film 15 has a large thickness in the recessed part 12 and a small thickness on the upper surface 13 of the semiconductor substrate 7).

In Comparative Example, in a case where the thickness of the insulating film 15 under the field plate electrode 11 is small, avalanche occurs in the vicinity of the end of the field plate electrode 11, which reduces device breakdown voltage. Therefore, the thickness of the insulating film 15 under the field plate electrode 11 needs to be large. However, the thickness of the insulating film 15 causes enlargement of the gap between the upper surface of the semiconductor substrate 7 and the upper surface of the insulating film 15. Enlargement of the gap causes unevenness in resist application during resist formation or a decrease in focus margin during photolithography after the formation of the gap.

On the other hand, in the first preferred embodiment of the present invention, the recessed part 12 is formed, and then the insulating film 15 is formed on the upper surface 13 of the semiconductor substrate 7 so as to fill the recessed part 12 (see FIGS. 4 to 6). Accordingly, as shown in FIGS. 1 and 8, in the semiconductor device according to the first preferred embodiment, the insulating film 15 has a large thickness above the RESURF layer 9 and a small thickness above the upper surface 13 of the semiconductor substrate 7.

In this manner, the thickness of the insulating film 15 is reduced on the upper surface 13 of the semiconductor substrate 7. Therefore, even when the resist application treatment is performed from the upper surface 13 of the semiconductor substrate 7 to the upper surface of the insulating film 15 after the formation of the insulating film 15, it is possible to suppress the generation of unevenness in application. In addition, even when photolithography is performed from the upper surface 13 of the semiconductor substrate 7 to the upper surface of the insulating film 15, it is possible to improve focus margin. Note that the insulating film 15 is capable of having a large thickness above the RESURF layer 9 owing to the presence of the recessed part 12. Accordingly, device breakdown voltage is improved as well.

Note that the description has been given of a case where the semiconductor substrate 7 has n type conductivity, the electrode layer 8 has p type conductivity, the RESURF layer 9 has p− type conductivity, and the channel stopper layer 10 has n+ type conductivity. However, each conductivity may be reversed. That is, the structure of FIG. 1 may be made such that the semiconductor substrate 7 has p type conductivity, the electrode layer 8 has n type conductivity, the RESURF layer 9 has n− type conductivity, and the channel stopper layer 10 has p+ type conductivity. Even with the structure in which each conductivity is reversed, similar effects as the above are obtained.

Further, the semiconductor substrate 7 may be formed of silicon (Si), or may be formed of a semiconductor of silicon carbide (SiC) or gallium nitride (GaN). Even when the semiconductor substrate 7 is formed of any semiconductor material, similar effects as the above are obtained Second Preferred Embodiment FIG. 10 shows simulation results, which shows the correlation between the depth of the RESURF layer 9 and the breakdown voltage of the high-breakdown-voltage semiconductor device (600 V class).

Figure 10:
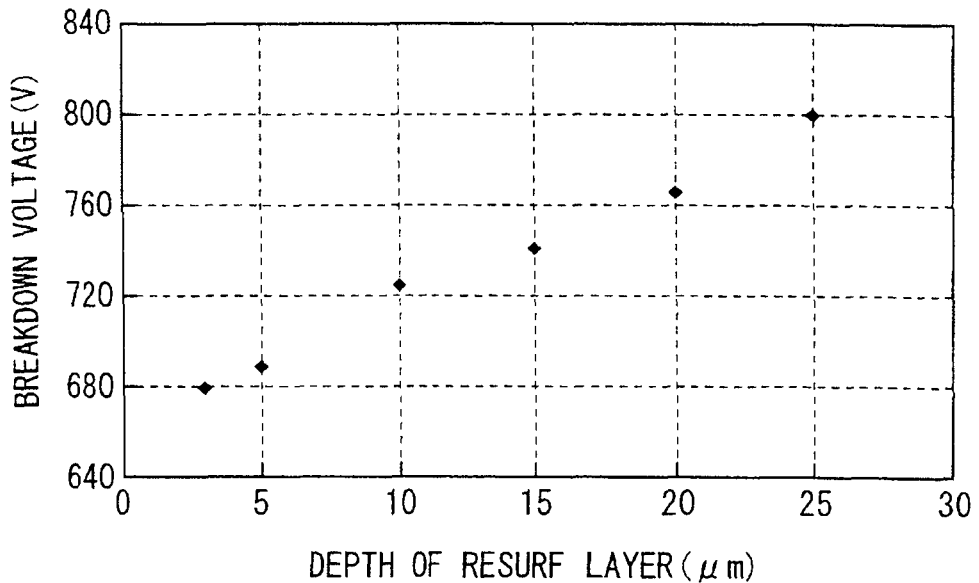
FIG. 10 shows simulation results, which shows the correlation between a depth of a RESURF layer and a breakdown voltage of a high-breakdown-voltage semiconductor device.

As can be seen from FIG. 10, the depth of the RESURF layer 9 is increased, whereby the breakdown voltage of the semiconductor device is improved. However, the impurity concentration of the RESURF layer 9 is approximately 1.0E15 atoms/cm³, which is extremely small. Accordingly, in order to form a deep RESURF layer 9, the thermal diffusion treatment for an extremely long period of time is required.

Figure 11:
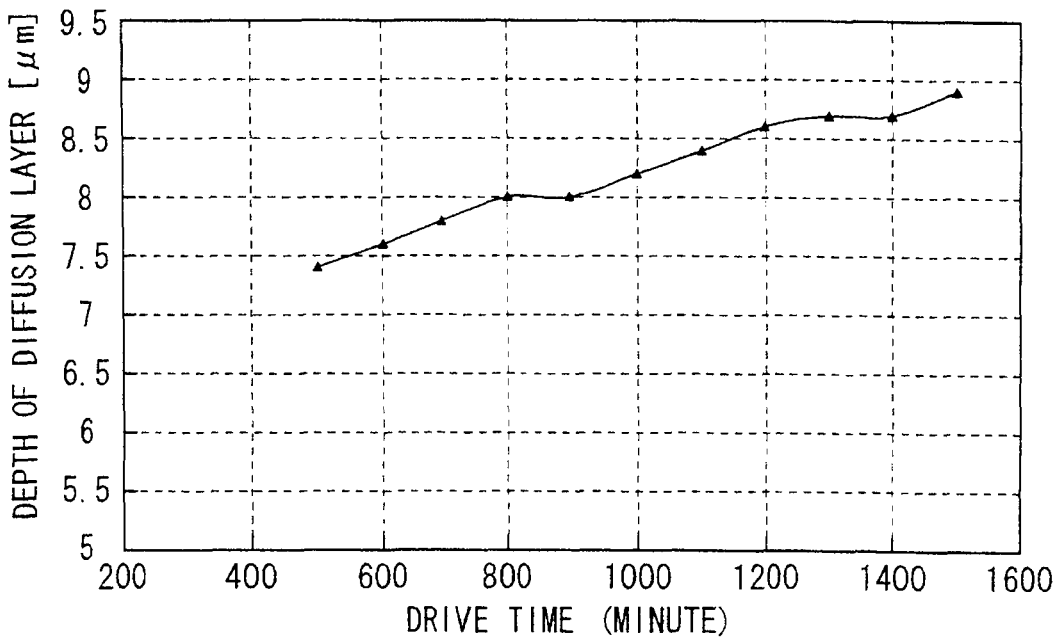
FIG. 11 shows simulation results, which shows the relationship between a drive time and a depth of a diffusion layer.

FIG. 11 shows simulation results, which shows the relationship between a drive time (thermal diffusion treatment time) and a depth of a diffusion layer in a case where the thermal diffusion treatment at 1,200° C. is assumed. In this simulation, the case is assumed where boron is implanted into an n type silicon substrate having a specific resistance of 23 Ω·cm on the conditions of acceleration voltage of 1.7 MeV and implantation amount of 1.0E12 atoms/cm².

As can be seen from FIG. 11, in order to obtain a diffusion depth of, for example, approximately 8.5 μm (in other words, in order to form the RESURF layer 9 having a depth of approximately 8.5 μm), an extremely long drive time (thermal diffusion treatment) for 1,200 minutes is required.

This preferred embodiment provides a method of manufacturing a semiconductor device, which achieves a reduction in drive time in forming the RESURF layer 9. Note that as apparent from the description below, the semiconductor device manufactured by the manufacturing method described in the first preferred embodiment and the semiconductor device manufactured by the manufacturing method described in a second preferred embodiment have the same structure.

The method of manufacturing a high-breakdown-voltage semiconductor device according to the second preferred embodiment is described below with reference to the process cross-sectional views.

First, there is prepared an n type conductivity semiconductor substrate 7 having a specific resistance p of 23 Ω·cm and a thickness of 725 μm.

Figure 12:
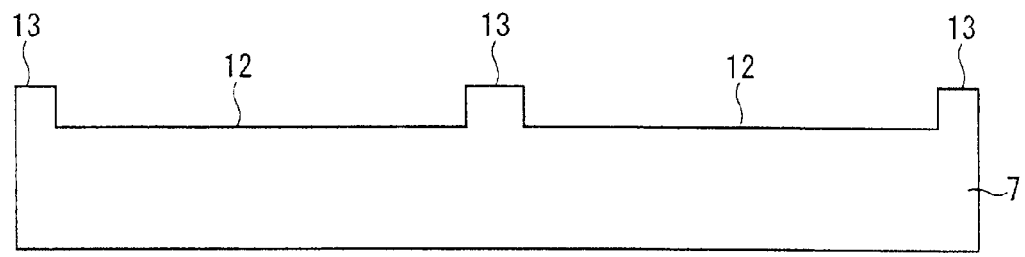
FIGS. 12 to 17 are process cross-sectional views for describing a method of manufacturing a semiconductor device according to a second preferred embodiment.

Then, a resist pattern is formed on the semiconductor substrate 7 by photolithography. After that, the resist pattern is used as a mask, to thereby perform etching on the semiconductor substrate 7. By the etching, a recessed part 12 having a depth of 1 μm is formed as shown in FIG. 12. Here, the resist pattern is not shown in FIG. 12. As shown in FIG. 12, as a result of the formation of the recessed part 12, an upper surface of the semiconductor substrate 7 is composed of bottom surfaces of the recessed parts 12 and the upper surface 13 located at a position higher than the bottom surface of the recessed part 12.

Figure 13:
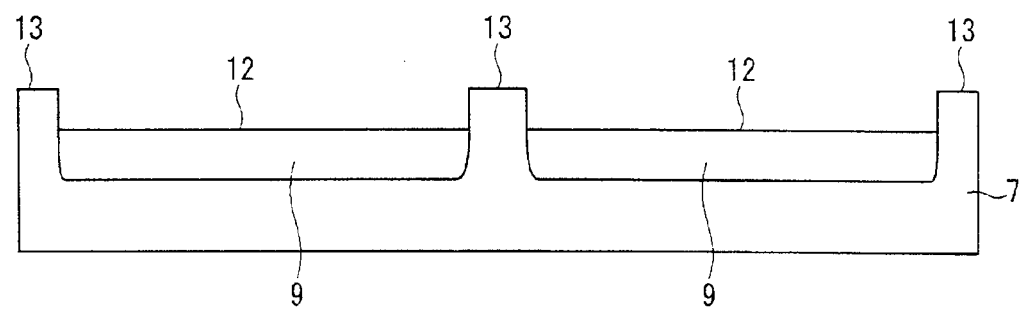

Next, the resist pattern used in the formation of the recessed part 12 is used again, to thereby implant boron ion (referred to as first boron ion implantation treatment) into the semiconductor substrate 7 (specifically, into the bottom surface of the recessed part 12). The first boron ion implantation treatment is performed on the conditions of, for example, implantation energy of 2.0 MeV and concentration of 1.0E12 atoms/cm². The resist pattern is removed after the first boron ion implantation treatment, to thereby perform thermal diffusion treatment on the semiconductor substrate 7. As a result, as shown in FIG. 13, a RESURF layer 9 of p type is formed in the surface of the semiconductor substrate 7 (more specifically, in the bottom surface of the recessed part 12). In this case, the thermal diffusion treatment is performed on the conditions of, for example, temperature of 1,200° C. and time of 600 min.

Figure 14:
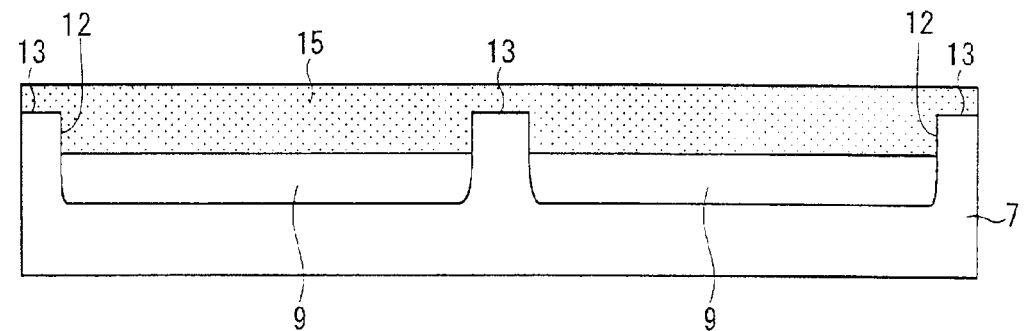

Then, thermal oxidation treatment is performed on the upper surface of the semiconductor substrate 7 in which the recessed parts 12 are formed. As a result of the thermal oxidation treatment, the insulating film 15 that is an oxide film is formed. After that, planarization treatment (for example, CMP treatment) is performed on the upper surface of the insulating film 15. As a result of the thermal oxidation treatment and planarization treatment, the insulating film 15 is formed on the upper surface 13 of the semiconductor substrate 7 so as to fill the recessed part 12, as shown in FIG. 14, and the upper surface of the insulating film 15 is planarized. The thickness of the insulating film 15 is approximately 1.5 μm in the recessed part 12.

After that, a resist pattern is formed on the insulating film 15 by photolithography again. Then, the resist pattern is used as a mask, to thereby perform dry etching on the insulating film 15. As a result of the dry etching, an opening is formed in the insulating film 15. The upper surface 13 of the semiconductor substrate 7 that is surrounded by the recessed parts 12 is partially exposed from a bottom surface of the opening.

Figure 15:
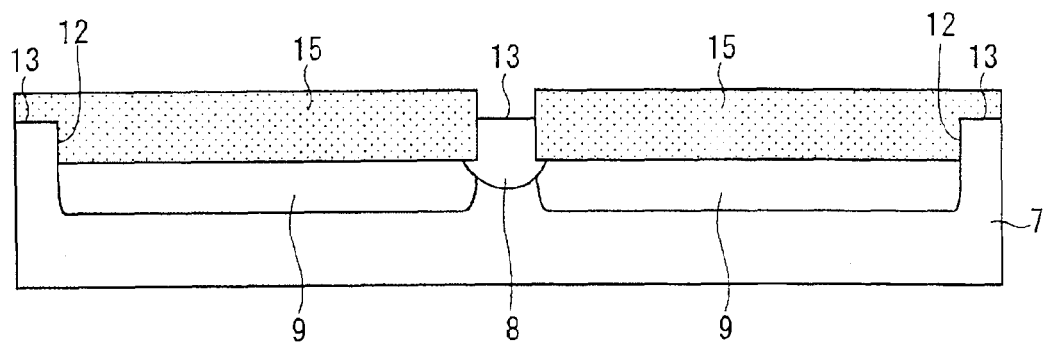

Next, the resist pattern and the insulating film 15 including the opening are used as a mask, to thereby implant boron ion (referred to as second boron ion implantation treatment) into the upper surface 13 of the semiconductor substrate 7 that is exposed from the opening. The second boron ion implantation treatment is performed on the conditions of, for example, implantation energy of 50 keV and concentration of 3.0E14 atoms/cm². The resist pattern is removed after the second boron ion implantation treatment, to thereby perform thermal diffusion treatment on the semiconductor substrate 7 again. As a result, as shown in FIG. 15, the electrode layer 8 of p type is formed in the surface of the semiconductor substrate 7. In this case, the thermal diffusion treatment is performed on the conditions of, for example, temperature of 1,150° C. and time of 300 min.

As can be seen from the conditions of the respective boron ion implantation treatments, the impurity ion concentration of the RESURF layer 9 is lower than the impurity concentration of the electrode layer 8. Moreover, as shown in FIG. 15, the RESURF layer 9 is located at a position deeper than the electrode layer 8. Note that both sides of the electrode layer 8 are in contact with the RESURF layer 9, and the RESURF layer 9 surrounds the electrode layer 8 in plan view. In addition, as shown in FIG. 15, the recessed part 12 partially crosses the electrode layer 8, and the electrode layer 8 is located at a position deeper than the recessed part 12. Accordingly, the electrode layer 8 is in contact with a bottom surface of the recessed part 12.

Then, a resist pattern is formed on the insulating film 15 and the semiconductor substrate 7 by the third photolithography. Although the resist pattern is not shown, the upper surface of the electrode layer 8 is covered with the resist pattern while a part of the insulating film 15 is exposed from an opening of the resist pattern.

Figure 16:
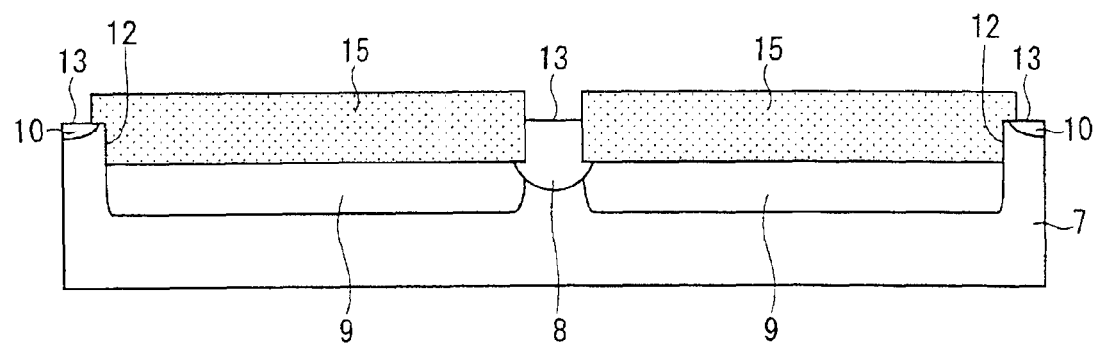

Then, the resist pattern in used as a mask, to thereby perform dry etching on the insulating film 15. As a result of the dry etching, an opening is formed in the insulating film 15. The upper surface 13 of the semiconductor substrate 7 is partially exposed from a bottom surface of part of the opening Then, the resist pattern and the insulating film 15 are used as a mask, and arsenic ion is implanted (referred to as arsenic ion implantation treatment) into the exposed upper surface 13 of the semiconductor substrate 7. The arsenic ion implantation treatment is performed on the conditions of, for example, implantation energy of 50 keV and concentration of 2.0E15 atoms/cm². The resist pattern is removed after the arsenic ion implantation treatment, to thereby perform thermal diffusion treatment on the semiconductor substrate 7 again. As a result, as shown in FIG. 16, the channel stopper layer 10 of n+ type is formed in the surface of the semiconductor substrate 7. In this case, the thermal diffusion treatment is performed on the conditions of, for example, temperature of 1,150° C. and time of 15 min. Note that in plan view, the channel stopper layer 10 surrounds the RESURF layer 9 with a predetermined distance.

Then, sputtering is performed on the semiconductor substrate 7 having the structure shown in FIG. 16 from the upper surface thereof. As a result of the sputtering, an aluminum (Al)-silicon (Si) film is formed on the upper surface 13 of the semiconductor substrate 7 and the upper surface of the insulating film 15. In this case, the thickness of the Al—Si film on the upper surface 13 of the semiconductor substrate 7 is, for example, 4 μm.

Figure 17:
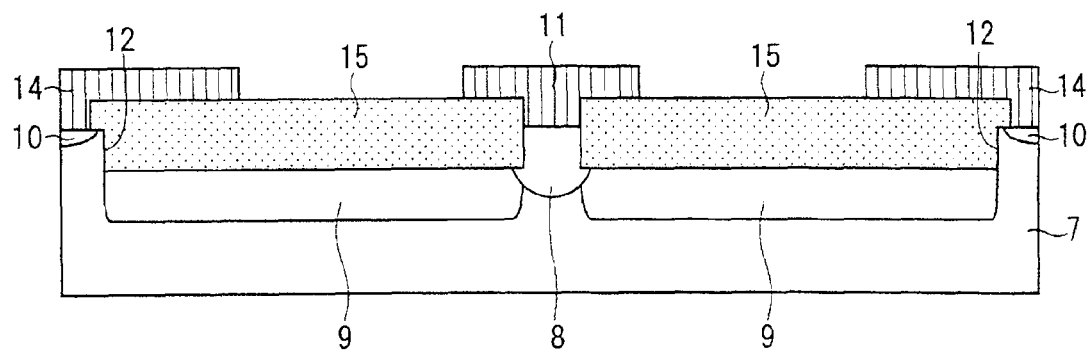

Then, a resist pattern is formed on the Al—Si film by the fourth photolithography. Then, the resist pattern is used as a mask, to thereby perform dry etching on the Al—Si film. The Al—Si film is partially removed by the dry etching, and thus, the field plate electrodes 11 and 14 are formed as shown in FIG. 17. As shown in FIG. 17, the field plate electrode 11 having a T-shaped cross section is formed from the upper surface of the electrode layer 8 to the upper surface of the insulating film 15. On the other hand, each field plate electrode 14 having an L-shaped cross section is formed from the upper surface of the channel stopper layer 10 to the upper surface of the insulating film 15.

In this preferred embodiment, the following effects are achieved in addition to the effects described in the first preferred embodiment.

That is, in a case of employing the manufacturing process described in the first preferred embodiment (that is, in a case where ion implantation treatment for the RESURF layer 9 is performed on the upper surface 13 of the semiconductor substrate 7), extremely long time is required for the thermal diffusion treatment for forming the RESURF layer 9. This is because the impurity concentration of the RESURF layer 9 is extremely small as described above.

On the other hand, in the manufacturing process described in this preferred embodiment, the recessed part 12 is formed in the semiconductor substrate 7, and then the formation treatment (such as ion implantation treatment) for the RESURF layer 9 is performed on the bottom surface of the recessed part 12.

Accordingly, an effective diffusion depth of the RESURF layer 9 is increased by a depth amount of the recessed part 12. Therefore, when the RESURF layer 9 is formed with a predetermined depth from the upper surface 13 of the semiconductor substrate 7, the thermal diffusion treatment for forming the RESURF layer 9 is shortened in a case where the manufacturing process according to this preferred embodiment is employed compared with a case where the manufacturing process according to the first preferred embodiment is employed.

Third Preferred Embodiment

Figures 18, 19:
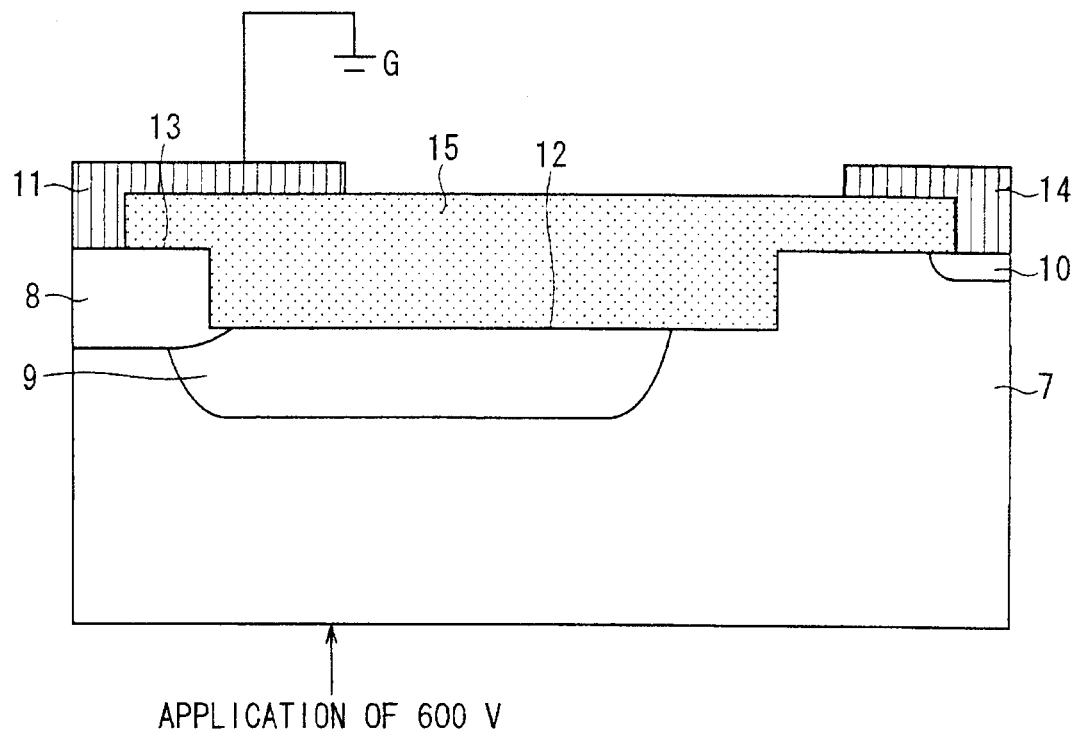
FIG. 18 shows experimental results, which shows the relationship between the presence/absence of unevenness in resist application and a gap generated between an upper surface of a semiconductor substrate and an upper surface of an insulating film.
FIG. 19 is a cross-sectional view showing a state in which a predetermined voltage is applied to a semiconductor device according to the present invention.

The description above has been given of a fact that a gap between the upper surface 13 of the semiconductor substrate 7 and the upper surface of the insulating film 15 is increased, whereby unevenness occurs in resist application when a resist is applied onto the gap. FIG. 18 shows experimental results, which shows the generation of unevenness in resist application that results from the gap. The experimental results shown in FIG. 18 are obtained by forming multiple types of gaps and the presence/absence of the generation of unevenness in resist application was examined for each gap.

In the experiment in which the results of FIG. 18 were obtained, oxidize films having different thicknesses were formed on an eight-inch silicon wafer, and the multiple types of gaps (five types of gaps: 0.5 μm, 0.8 μm, 1.0 μm, 1.5 μm and 2.0 μm) described above were formed. Then, a positive resist having viscosity of 19 cp was applied onto the gaps at the number of revolutions of 1,400 rpm, to thereby form a resist having a film thickness of 1.8 μm.

It is revealed that in the experiment in which the results shown in FIG. 18 were obtained and other experiment, on typical resist application conditions, unevenness occurs in resist application when the gap between the upper surface 13 of the semiconductor substrate 7 and the upper surface of the insulating film 15 is equal to or larger than 1.0 μm.

From the above, it is revealed that effects of the structure of the semiconductor device according to the present invention are effectively exhibited in a case where the insulating film 15 of 1.0 μm or more needs to be formed above the RESURF layer 9.

For example, an assumption is made on the structure in which the insulating film 15 having a thickness of approximately 1.5 μm needs to be formed between the RESURF layer 9 and the field plate electrode 11.

In a case of the structure of FIG. 9, which is Comparative Example, a magnitude of the gap between the upper surface of the semiconductor substrate 7 and the upper surface of the insulating film 15 is 1.5 μm without change. Therefore, unevenness occurs in resist application because the gap is 1.5 μm.

In contrast, it is assumed that the structure according to the present invention in which the recessed part 12 is formed is employed and that the depth of the recessed part 12 is set to, for example, 1.0 μm. In this case, even when the insulating film 15 having a thickness of approximately 1.5 μm is formed between the RESURF layer 9 and the field plate electrode 11, the gap between the upper surface 13 of the semiconductor substrate 7 and the upper surface of the insulating film 15 is only required to be approximately 0.5 μm. Unevenness in resist application is not generated in the gap of approximately 0.5 μm.

As described above, in a case of the structure in which the thickness of the insulating film 15 between the RESURF layer 9 and the field plate electrode 11 (in other words, thickness of the insulating film 15 formed in the recessed part 12) is 1 μm or larger, the effects of the semiconductor device according to the present invention are effectively exhibited.

Fourth Preferred Embodiment

As shown in FIG. 19, it is assumed that in the semiconductor device according to the present invention, the field plate electrode 11 is connected to the ground and 600 V is applied to a lower surface of the semiconductor substrate 7. As shown in an enlarged cross-sectional view of FIG. 20, it is assumed here that a lateral surface of the recessed part 12 is not tapered. That is, it is assumed that the lateral surface of the recessed part 12 is formed perpendicularly to the bottom surface of the recessed part 12. In this case, in regions in the vicinity of the recessed part 12, the electrode layer 8 and the RESURF layer 9, electric field distribution shown in FIG. 21 is formed. FIG. 21 shows simulation results in which the voltage application and the structures of FIGS. 19 and 20 are assumed.

Figure 20:
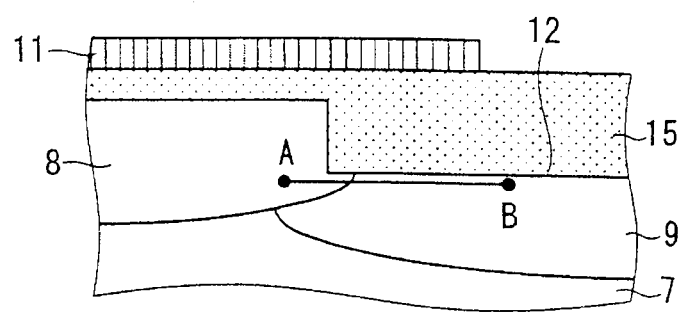
FIG. 20 is an enlarged cross-sectional view showing a recessed part whose lateral surface is not tapered and a periphery structure of the recessed part.
Figure 21:
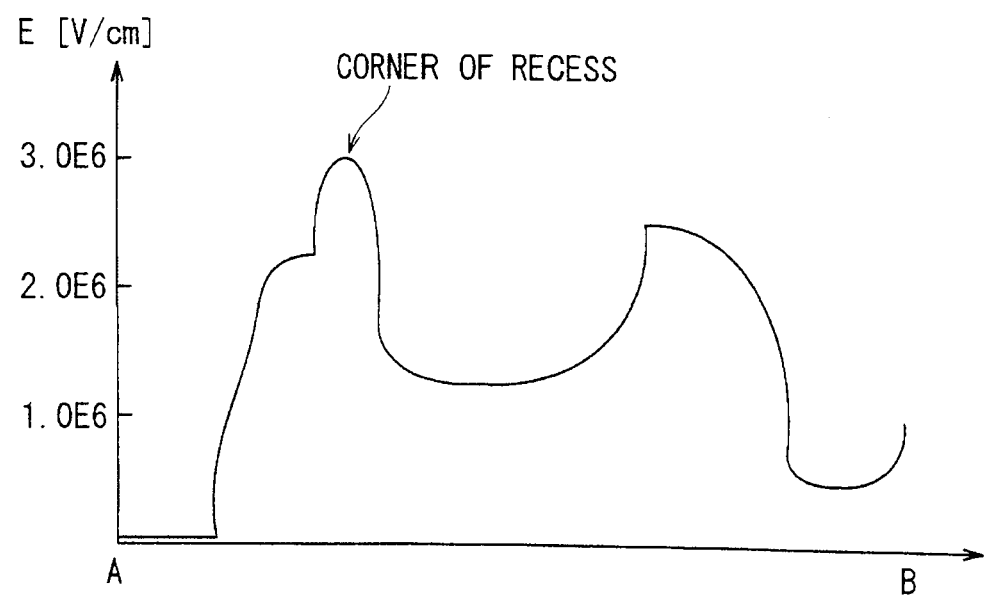
FIG. 21 shows simulation results, which shows a state of electric field distribution in the vicinity of the recessed part in a case where the recessed part is not tapered.

In FIG. 21, A-B of a horizontal axis corresponds to an A-B region shown in FIG. 20. A vertical axis represents field intensity (V/cm).

As can be seen from FIG. 21, in a case of a shape of the recessed part 12 shown in FIG. 20, the field intensity abruptly increases in a corner part of the recessed part 12 (intersecting part between the bottom surface of the recessed part 12 and the lateral surface of the recessed part 12). That is, the region in the vicinity of the corner part of the recessed part 12 has the largest field intensity. The abrupt increase in field intensity results in the breakdown voltage of the semiconductor device being unstably maintained.

Therefore, in the semiconductor device according to this preferred embodiment, the lateral surface of the recessed part 12 has a tapered shape.

Figure 22:
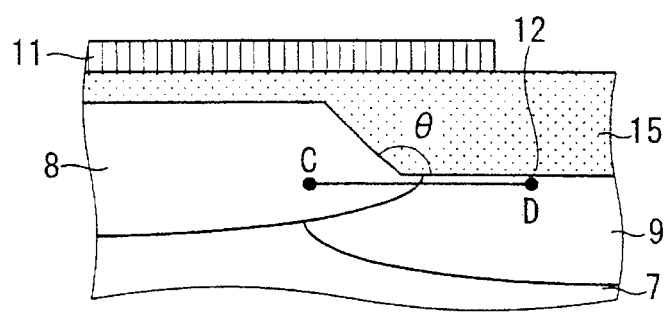
FIG. 22 is an enlarged cross-sectional view showing a recessed part whose lateral surface is tapered and a periphery structure of the recessed part.

Specifically, as shown in an enlarged cross-sectional view of FIG. 22, in this preferred embodiment, an angle θ between the bottom surface of the recessed part 12 and the lateral surface of the recessed part 12 is larger than 90° (θ>90°).

Figure 23:
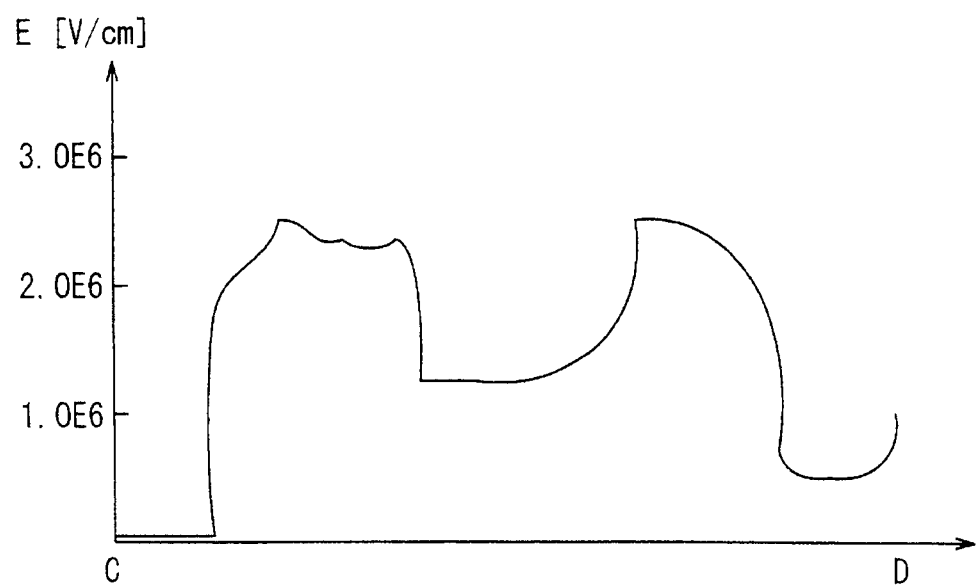
FIG. 23 shows simulation results, which shows a state of electric field distribution in the vicinity of the recessed part in a case where the recessed part is tapered.

It is assumed that the shape of FIG. 22 is employed as the shape of the recessed part 12 in the structure shown in FIG. 1, that the field plate electrode 11 is connected to the ground, and that 600 V is applied to the lower surface of the semiconductor substrate 7. In this case, electric field distribution shown in FIG. 23 is formed in the regions in the vicinity of the recessed part 12, the electrode layer 8 and the RESURF layer 9. FIG. 23 shows simulation results in which the voltage application and the structures of FIGS. 1 and 22 are assumed.

In FIG. 23, C-D of a horizontal axis corresponds to a C-D region shown in FIG. 22. A vertical axis represents field intensity (V/cm).

As can be seen from comparison between FIGS. 21 and 23, in the case of the shape of the recessed part 12 shown in FIG. 22 (that is, when the lateral surface of the recessed part 12 is tapered), an electric field in the vicinity of the corner part of the recessed part 12 is mitigated.

As described above, in the semiconductor device according to this preferred embodiment, the lateral surface of the recessed part 12 has a tapered shape. Accordingly, the electric field in the vicinity of the corner part of the recessed part 12 is mitigated. Therefore, the breakdown voltage of the semiconductor device is more stably maintained.

Fifth Preferred Embodiment

In this preferred embodiment, a method of forming the recessed part 12 (see FIG. 22) in which the lateral surface thereof has a tapered shape, which has been described in the fourth preferred embodiment, is described with reference to enlarged process cross-sectional views. Note that each of the enlarged process cross-sectional views shows an enlarged region in the vicinity of the lateral surface of the recessed part 12 to be formed.

The manufacturing process that is described in this preferred embodiment is regarded to specifically describe the process of forming the recessed part 12 described with reference to FIG. 4 or 12.

Figure 24:
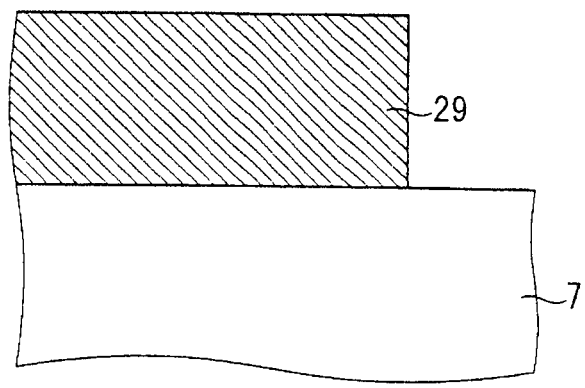
FIGS. 24 to 26 are process cross-sectional views for describing a method of manufacturing a semiconductor device according to a fifth preferred embodiment.

First, photolithography is performed on the upper surface of the semiconductor substrate 7. As a result, as shown in FIG. 24, a resist pattern 29 having an opening is formed on the upper surface of the semiconductor substrate 7, as shown in FIG. 24. In this case, a region in which the recessed part 12 is to be formed on the upper surface of the semiconductor substrate 7 is exposed from the bottom surface of the opening.

Figure 25:
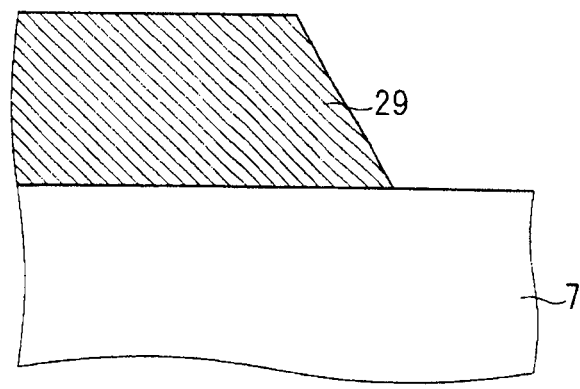

Then, post-baking is performed on the resist pattern 29. Here, the post baking is performed on the conditions of, for example, temperature of 130° C. and time of 150 sec. As a result of the post baking, the resist pattern 29 shrinks, and the lateral surface of the opening of the resist pattern 29 is tapered as shown in FIG. 25. That is, a width dimension of the opening of the resist pattern 29 gradually increases from the bottom surface to the upper surface of the opening.

Figure 26:
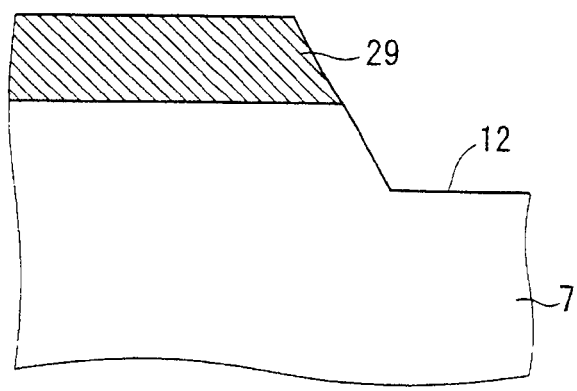

Then, the resist pattern 29 is used as a mask, and etching is performed on the upper surface of the semiconductor substrate 7. As a result of the etching, as shown in FIG. 26, the recessed part 12 whose lateral surface has a tapered shape is formed in the surface of the semiconductor substrate 7.

In this case, if the semiconductor substrate 7 is etched by a larger amount than the resist pattern 29, the tapered shape of the resist pattern 29 is not reflected on the shape of the recessed part 12 formed on the semiconductor substrate 7. Accordingly, though depending on a degree of slope of the tapered shape to be formed in the resist pattern 29, an etching selection ratio (etching amount of the semiconductor substrate 7/etching amount of the resist pattern 29) is desirably two or smaller. In a case where the etching selection ratio is one, the tapered shape of the resist pattern 29 is reflected on the tapered shape of the recessed part 12 without change.

As described above, in this preferred embodiment, the resist pattern 29 having an opening whose lateral surface is tapered is formed on the semiconductor substrate 7. Then, the resist pattern 29 is used as a mask, to thereby perform etching on the semiconductor substrate 7.

Therefore, it is possible to easily form the recessed part 12 whose lateral surface has a tapered shape in the surface of the semiconductor substrate 7.

Further, the etching is performed on the condition that the etching selection ratio is one, whereby it is possible to reflect the tapered shape of the opening of the resist pattern 29 on the lateral surface of the recessed part 12 without change.

Sixth Preferred Embodiment

In a corner part in which the bottom surface of the recessed part 12 and the lateral surface of the recessed part 12 are connected to each other, the electric field generated in the semiconductor substrate 7 is concentrated more easily. Accordingly, the mitigation of electric field in the corner part leads to the breakdown voltage of the semiconductor device being stably maintained.

Figure 27:
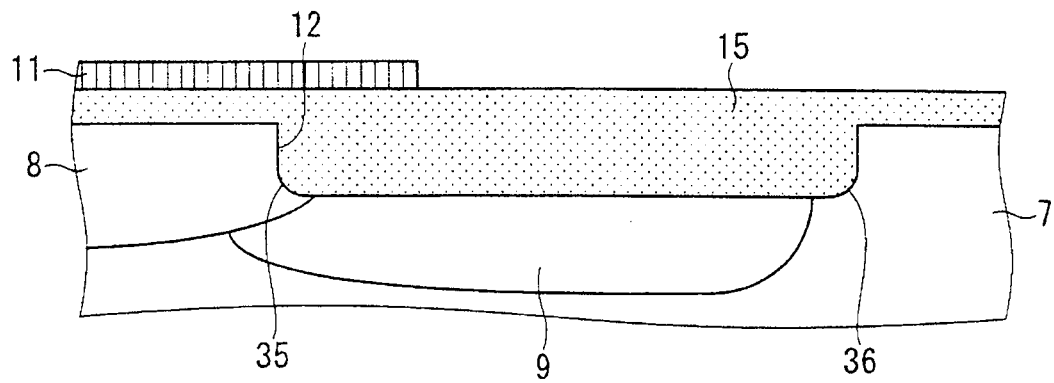
FIG. 27 is a cross-sectional view showing a structure of a semiconductor device according to a sixth preferred embodiment.

Therefore, in this preferred embodiment, corner parts 35 and 36 connected to the bottom surface of the recessed part 12 are rounded (that is, have a round shape). FIG. 27 is a cross-sectional view showing the structure of the recessed part 12 and its periphery according to this preferred embodiment.

As shown in FIG. 27, the corner parts 35 and 36 in which the bottom surface of the recessed part 12 and the lateral surface of the recessed part 12 are connected to each other are rounded. For example, a method of forming the recessed part 12 is as follows.

First, in the structure shown in FIG. 4 or 12, a thermal oxide film is formed on the recessed part 12. After that, the thermal oxide film is removed, whereby the corner parts 35 and 36 of the recessed part 12 are rounded.

As described above, in the recessed part 12 according to this preferred embodiment, the corner parts 35 and 36 of the recessed part 12 are rounded. Therefore, compared with a case where corner parts are squared, concentration of the electric field is mitigated in the rounded corner parts 35 and 36. As a result, it is possible to stably maintain breakdown voltage of the semiconductor device.

Seventh Preferred Embodiment

Figure 28:
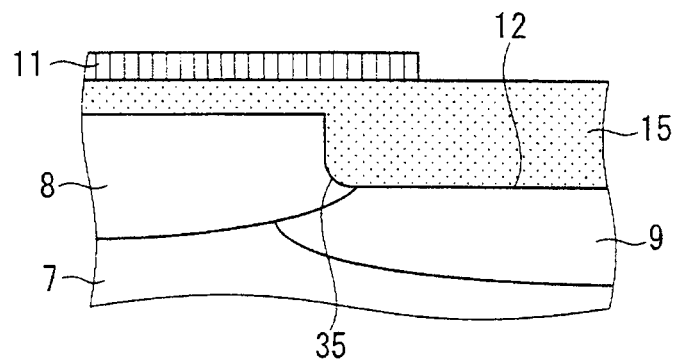
FIG. 28 is a cross-sectional view showing a structure of a semiconductor device according to a seventh preferred embodiment.

As described in the sixth preferred embodiment, in the corner parts connected to the bottom surface of the recessed part 12, the electric field generated in the semiconductor substrate 7 is concentrated more easily. In this preferred embodiment, the corner part that is in contact with the bottom surface of the recessed part 12 is covered with the electrode layer 8. FIG. 28 is an enlarged cross-sectional view showing the structure of the semiconductor device according to this preferred embodiment.

As shown in FIG. 28, in this preferred embodiment, the corner part 35 in which the bottom surface of the recessed part 12 and the lateral surface of the recessed part 12 are connected to each other is covered with the electrode layer 8 from downward, on the side being in contact with the electrode layer 8. Therefore, the electrode layer 8 is in contact with the lateral surface of the recessed part 12 and part of the bottom surface of the recessed part 12.

As described above, in this preferred embodiment, the corner part 35 of the recessed part 12 is covered with the electrode layer 8. Therefore, compared with the structure in which the corner part 35 of the recessed part 12 is not covered with the electrode layer 8 (see FIG. 29), with the structure of FIG. 28, concentration of the electric field is mitigated on the corner part 35. As a result, it is possible to stably maintain the breakdown voltage of the semiconductor device.

Figure 29:
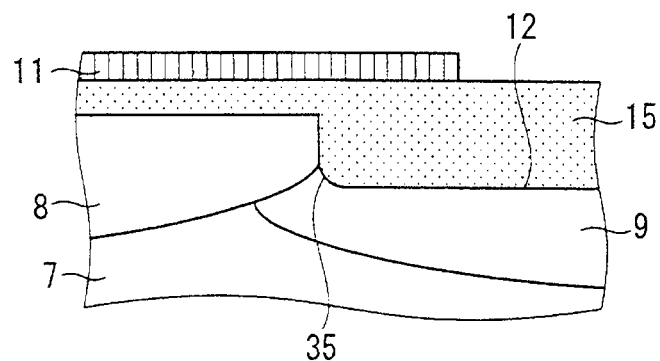
FIG. 29 is a cross-sectional view showing a structure in which a corner part of a recessed part is not covered with an electrode layer.

Note that in the structure in which the corner part 35 of the recessed part 12 is not covered with the electrode layer 8, which is shown in FIG. 29, the electrode layer 8 is in contact with only the lateral surface of the recessed part 12.

Eighth Preferred Embodiment

As described in the sixth and seventh preferred embodiments, in the corner part connected to the bottom surface of the recessed part 12, the electric field generated in the semiconductor substrate 7 is concentrated more easily. For this reason, in this preferred embodiment, the field plate electrode 11 is formed so as to completely cover the corner part 35 connected to the bottom surface of the recessed part 12, in plan view. FIG. 30 is an enlarged cross-sectional view showing the structure of a semiconductor device according to this preferred embodiment.

Now, attention is focused on the recessed part 12 side to be connected to the electrode layer 8. As shown in FIG. 30, the corner part 35 of the recessed part 12 that is connected to the bottom surface of the recessed part 12 is rounded. Therefore, the corner part 35 has a predetermined width in plan view. In addition, as shown in FIG. 30, when the semiconductor device is viewed from thereabove, the field plate electrode 11 formed on the insulating film 15 completely covers the corner part 35 connected to the bottom surface of the recessed part 12. Therefore, the field plate electrode 11 is formed from above the electrode layer 8 to above the bottom surface of the recessed part 12 connected to the corner part 35.

As described above, in this preferred embodiment, the corner part 35 of the recessed part 12 is completely covered with the field plate electrode 11, in plan view. Accordingly, compared with the structure in which the corner part 35 of the recessed part 12 is not completely covered with the field plate electrode 11 (see FIG. 31), with the structure of FIG. 30, field plate effects are exhibited more. Therefore, concentration of an electric field is mitigated on the corner part 35, and accordingly, it is possible to stably maintain the breakdown voltage of the semiconductor device.

Note that in the structure in which the corner part 35 of the recessed part 12 is not completely covered with the field plate electrode 11, which is shown in FIG. 31, the field plate electrode 11 covers only a part of the rounded corner part 35 in plan view.

In each of the preferred embodiments described above, a diode is assumed to be a semiconductor device. However, the structure of the semiconductor device according to each of the preferred embodiments described above is applicable to other high-breakdown-voltage semiconductor device including a RESURF layer and a field plate electrode formed on the insulating film 15, such as bipolar transistor, power metal oxide semiconductor field effect transistor (MOSFET) and insulated gate bipolar transistor (IGBT).

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
   a semiconductor substrate having a first conductivity type and having an upper surface on which a recessed part is formed;

an electrode layer formed in a surface of said semiconductor substrate so as to be adjacent to said recessed part and having a second conductivity type;

a reduced surface field layer formed in said semiconductor substrate so as to be in contact with a bottom surface of said recessed part and said electrode layer and containing impurities of said second conductivity type lower in concentration than said electrode layer;

an insulating oxide film formed on the upper surface of said semiconductor substrate so as to entirely fill said recessed part; and a field plate electrode formed directly on a top surface of said insulating oxide film above said recessed part, wherein a depth of the recessed part from the bottom surface of the recessed part to the upper surface of the semiconductor substrate filled entirely by the insulating oxide film is greater than a thickness of the insulating oxide film outside of the recessed part, a film thickness of said insulating oxide film in said recessed part is 1.0 μm or more, and a thickness of a gap extending from the top surface of said semiconductor substrate outside of the recessed part to a bottom surface of the field plate electrode formed directly on the top surface of said insulating oxide film, the thickness of the gap corresponding to the thickness of the insulating oxide film outside of the recessed part, is less than 1.0 μm, and a ratio between the depth and the thickness is substantially 2:1.

2. The semiconductor device according to claim 1, wherein a lateral surface of said recessed part has a tapered shape.

3. The semiconductor device according to claim 1, wherein a corner part of said recessed part connected to the bottom surface of said recessed part is rounded.

4. The semiconductor device according to claim 1, wherein a corner part of said recessed part connected to the bottom surface of said recessed part is covered with said electrode layer.

5. The semiconductor device according to claim 1, wherein said field plate electrode is formed so as to cover a corner part of said recessed part connected to the bottom surface of said recessed part in plain view.

6. The semiconductor device according to claim 1, wherein said semiconductor substrate contains one of silicon, silicon carbide and gallium nitride.

7. The semiconductor device according to claim 1, wherein an upper surface of the insulating oxide film is planarized entirely from a part of the insulating oxide film formed on the recessed part to a part of the insulating oxide film outside of the recessed part.

8. The semiconductor device according to claim 1, wherein a corner part of the recessed part in which the bottom surface of the recessed part and a vertical surface of the recessed part are connected is covered with the electrode layer.

9. The semiconductor device according to claim 1, wherein the depth is 1.0 μm and the thickness is 0.5 μm.

10. The semiconductor device according to claim 1, wherein the insulating oxide film is formed in a single layer on the upper surface of said semiconductor substrate so as to entirely fill said recessed part.

* * * * *